(12) United States Patent
Annunziata

(10) Patent No.: US 9,165,675 B2
(45) Date of Patent: Oct. 20, 2015

(54) RACETRACK MEMORY CELLS WITH A VERTICAL NANOWIRE STORAGE ELEMENT

(71) Applicant: International Business Machines Corporation, Armonk, NY (US)

(72) Inventor: Anthony J. Annunziata, Stamford, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 157 days.

(21) Appl. No.: 13/970,759

(22) Filed: Aug. 20, 2013

(65) Prior Publication Data

US 2014/0204648 A1    Jul. 24, 2014

Related U.S. Application Data

(63) Continuation of application No. 13/745,963, filed on Jan. 21, 2013.

(51) Int. Cl.
| | |
|---|---|
| G11C 19/00 | (2006.01) |
| G11C 19/08 | (2006.01) |
| H01L 43/12 | (2006.01) |
| G11C 19/02 | (2006.01) |
| H01L 49/02 | (2006.01) |
| H01L 43/08 | (2006.01) |
| G11C 11/15 | (2006.01) |

(52) U.S. Cl.
CPC ............ *G11C 19/0808* (2013.01); *G11C 11/15* (2013.01); *G11C 19/02* (2013.01); *G11C 19/0841* (2013.01); *H01L 28/20* (2013.01); *H01L 43/08* (2013.01); *H01L 43/12* (2013.01); *Y10S 977/762* (2013.01); *Y10S 977/84* (2013.01); *Y10S 977/943* (2013.01)

(58) Field of Classification Search
CPC ....................................................... G11C 11/00
USPC ......... 365/48, 55, 62, 66, 74, 78, 80–93, 100, 365/130, 131, 148, 158, 171–173, 225.5, 365/243.5; 257/421, E21.665; 438/3; 977/933–935
See application file for complete search history.

(56) References Cited

U.S. PATENT DOCUMENTS

| 3,366,936 A | 1/1968 | Snyder |
| 3,439,352 A | 4/1969 | Fischer |
| 3,453,609 A | 7/1969 | Bonyhard et al. |
| 6,834,005 B1 | 12/2004 | Parkin |
| 6,955,926 B2 | 10/2005 | Chen et al. |

(Continued)

FOREIGN PATENT DOCUMENTS

| KR | 1020110014845 | 2/2011 |
| WO | 2012076871 A1 | 6/2012 |

OTHER PUBLICATIONS

A. J. Annunziata et al; "Racetrack Memory Cell Array wiht Integrated Magnetic Tunnel Junction Readout;" IEEE; IEDM 11-539; 2011; pp. 24.3.1-24.3.4.

*Primary Examiner* — Harry W Byrne
(74) *Attorney, Agent, or Firm* — Cantor Colburn LLP

(57) ABSTRACT

A racetrack memory cell device include a dielectric, an electrode disposed in the dielectric, a metal strap disposed in the dielectric, a nanowire disposed in the dielectric between the electrode and the metal strap and a magnetic tunnel junction disposed in the dielectric on the metal strap, and axially with the nanowire.

8 Claims, 6 Drawing Sheets

(56) References Cited

U.S. PATENT DOCUMENTS

| | | |
|---|---|---|
| 7,031,178 B2 | 4/2006 | Parkin |
| 7,108,797 B2 | 9/2006 | Chen et al. |
| 7,416,905 B2 | 8/2008 | Chen et al. |
| 7,551,469 B1 | 6/2009 | Parkin |
| 7,598,097 B2 | 10/2009 | Chen et al. |
| 7,710,769 B2 | 5/2010 | Cowburn et al. |
| 7,710,770 B2 | 5/2010 | Cowburn et al. |
| 7,755,921 B2 | 7/2010 | Assefa et al. |
| 7,768,809 B2 | 8/2010 | Trouilloud |
| 7,843,719 B2 | 11/2010 | Hung et al. |
| 8,184,473 B2 | 5/2012 | Yoo et al. |
| 2004/0251232 A1 | 12/2004 | Chen et al. |
| 2004/0252539 A1 | 12/2004 | Parkin |
| 2005/0094427 A1 | 5/2005 | Parkin |
| 2005/0186686 A1 | 8/2005 | Chen et al. |
| 2006/0034116 A1 | 2/2006 | Lam et al. |
| 2007/0087454 A1 | 4/2007 | Chen et al. |
| 2007/0200477 A1 | 8/2007 | Tuominen et al. |
| 2008/0241369 A1 | 10/2008 | Chen et al. |
| 2009/0168493 A1* | 7/2009 | Kim et al. ............... 365/148 |
| 2009/0303631 A1 | 12/2009 | Rhie |
| 2010/0002486 A1 | 1/2010 | Debrosse et al. |
| 2010/0046268 A1 | 2/2010 | Moriya et al. |
| 2010/0073984 A1 | 3/2010 | Xi et al. |
| 2010/0080034 A1 | 4/2010 | Hung |
| 2010/0085793 A1 | 4/2010 | Trouilloud |
| 2010/0118583 A1 | 5/2010 | Hung et al. |
| 2010/0148288 A1* | 6/2010 | Johnson ............... 257/421 |
| 2010/0321993 A1 | 12/2010 | Nikonov et al. |
| 2011/0163402 A1* | 7/2011 | Fukami et al. ............. 257/421 |

* cited by examiner

RACETRACK MEMORY CELLS WITH A VERTICAL NANOWIRE STORAGE ELEMENT

CROSS-REFERENCE TO RELATED APPLICATION

This application is a continuation of U.S. patent application Ser. No. 13/745,963, filed Jan. 21, 2013, the disclosure of which is incorporated by reference herein in its entirety.

BACKGROUND

The present invention relates to racetrack memory devices, and more specifically, to racetrack memory cells having vertical nanowire storage elements.

Racetrack memory is a type of non-volatile magnetic memory that utilizes current-controlled motion of magnetic domain walls in a magnetic nanowire to encode information. Multiple magnetic domain walls can be moved along the nanowire "racetrack." In typical configurations, a magnetic tunnel junction (MTJ) is located at a distinct location along the track; the MTJ is used to read out the device by sensing the magnetization of the nanowire as domain walls shift through the nanowire.

Typical configurations implement in-plane nanowires, horizontally positioned with respect to the wafer plane. It had been theorized that to achieve very high bit density, the ideal racetrack memory cell would have the racetrack nanowire oriented perpendicular to the wafer plane. Devices with such vertically oriented racetracks are extremely challenging to build, and there have been proposals for vertical racetrack cells but few structures proposed that have any specific details about the structure or fabrication methods, and no practical method proposed to integrate an MTJ for readout. Furthermore, integration of an MTJ in direct contact with the nanowire is challenging even in planar-nanowire configurations, because it often introduces process defects that lead to pinning of the domain walls at the site of the MTJ. To date there is no known fabrication method for vertical nanowires.

SUMMARY

Exemplary embodiments include a racetrack memory cell device, including a dielectric, an electrode disposed in the dielectric, a metal strap disposed in the dielectric, a nanowire disposed in the dielectric between the electrode and the metal strap and a magnetic tunnel junction disposed in the dielectric on the metal strap, and axially with the nanowire.

Additional exemplary embodiments include a method of operating a racetrack memory cell device the method including writing and shifting a domain wall in a nanowire, reading a domain magnetization from the nanowire and shifting the domain wall in the nanowire.

Further exemplary embodiments include a method of fabricating a racetrack memory cell device, the method including forming an electrode in a dielectric and forming a vertically oriented nanowire in the dielectric and coupled to the electrode.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In exemplary embodiments, the systems and methods described herein integrate vertically oriented racetrack memory nanowires into a standard complementary metal-oxide-semiconductor (CMOS) back end of line, using standard CMOS fabrication methods and standard magnetic material deposition techniques. The exemplary structures and methods described herein implement a magnetic domain wall shift register memory cell that utilizes a vertically-oriented nanowire and a MTJ located directly above the vertical nanowire. In exemplary embodiments, a vertically-oriented magnetic nanowire is capable of storing multiple magnetic domain walls with a size and aspect ratio that enable high bit density and incorporation into a standard CMOS back end of line, using standard CMOS processing methods and standard magnetic material deposition techniques. In addition, the systems and methods described herein implement MTJ readout that isolates the junction from the nanowire, but maintains the MTJ in very close proximity to the nanowire to enable a large signal. In addition, the cell topology described herein is compatible with standard CMOS integration. The exemplary systems and methods described herein further implement a write/read/write-back method for operating the cell.

Figure 1:
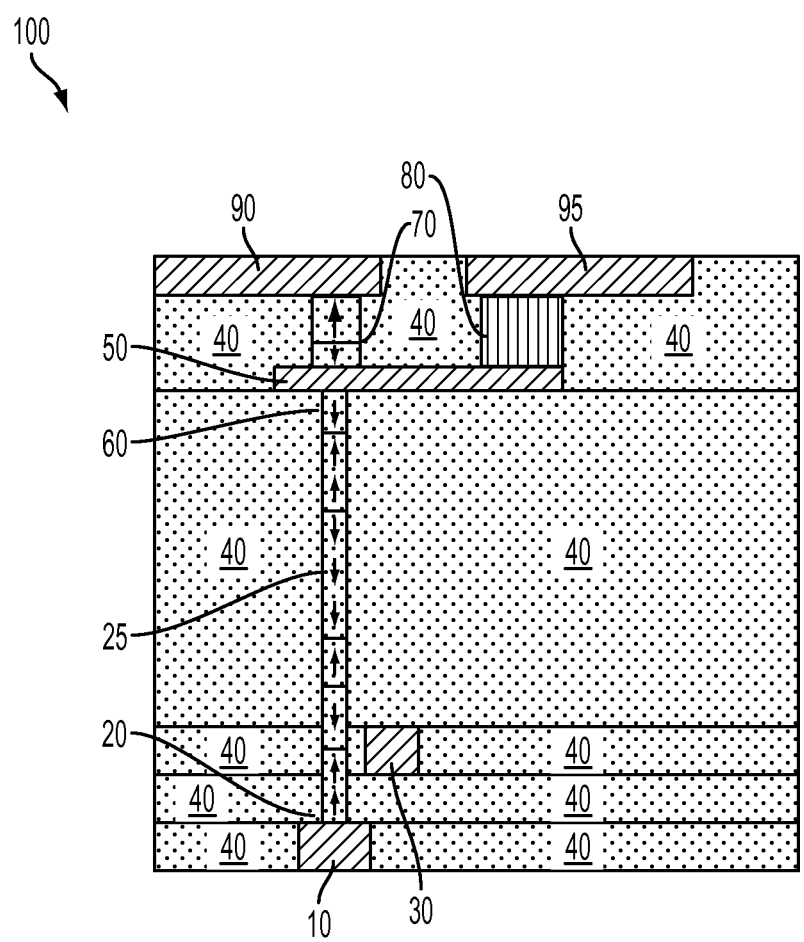
FIG. 1 illustrates an exemplary racetrack memory cell device.

FIG. 1 illustrates an exemplary racetrack memory cell device 100. The device 100 includes a base electrode 10 that is embedded in a dielectric 40. It will be appreciated that there are several separately deposited dielectric layers, collectively illustrated as a dielectric 40, as further described herein. A vertically-oriented magnetic nanowire column 25 is disposed throughout layers of the dielectric 40. In exemplary embodiments, one end 20 of the vertically-oriented magnetic nanowire column 25 is electrically coupled to the electrode 10. In exemplary embodiments, a domain wall (DW) injection line 30 is disposed in the dielectric 40 adjacent the vertically-oriented magnetic nanowire column 25. The domain wall (DW) injection line 30 controls the generation (i.e., writing) and position (e.g., the local parallel or perpendicular anisotropy) of the domain walls within the vertically-oriented magnetic nanowire column 25. Another end 60 of the vertically-oriented magnetic nanowire column 25 is coupled to a metal "strap" 50 that is also embedded in the dielectric 40. In exemplary embodiments, the device 100 further includes an MTJ 70 disposed in the dielectric 40, and positioned axially with the vertically-oriented magnetic nanowire column 25, adjacent the end 60 of the vertically-oriented magnetic nanowire column 25 and coupled to the metal strap 50. As described herein, the axial and adjacent position of the MTJ 70, as well as the vertical positioning of vertically-oriented magnetic nanowire column 25, places the MTJ 70 out of the conventional side positioning of current MTJs, allowing the vertically-oriented magnetic nanowire column 25 to store multiple magnetic domain walls with a size and aspect ratio that enable high bit density and incorporation into a standard CMOS back end of line using standard CMOS processing methods and standard magnetic material deposition techniques.

In addition, the MTJ readout isolates the MTJ 70 from the vertically-oriented magnetic nanowire column 25, but maintains the MTJ 70 in very close proximity to the vertically-oriented magnetic nanowire column 25 to enable a large signal. The device 100 further includes a top contact 90 for the MTJ 70 and a bottom contact 95 for the MTJ 70. In exemplary embodiments, the top contact 90 is coupled directly to the MTJ 70. The bottom contact 95 is coupled indirectly to the MTJ 70, via the metal strap 50. As illustrated, the metal strap 50 is coupled directly to the MTJ. The device 100 further includes a via 80 embedded in the dielectric 40 and coupled to the metal strap 50 adjacent and parallel to the MTJ 70. The bottom contact 95 is coupled to the via 80 thereby indirectly coupling to the MTJ 70. In other exemplary embodiments, the via 80 can be replaced with another MTJ. Regardless, a current path is provided through the bottom contact 95, the via 80 the metal strap 50, and to the MTJ 70.

The exemplary racetrack memory cell device 100 can store multiple bits of data in multiple magnetic domains separated by mobile domain walls in the vertically-oriented magnetic nanowire column 25. The bits of data can be moved up and down along the vertically-oriented magnetic nanowire column 25 using electrical current pulses.

The exemplary racetrack memory cell device 100 is read out via the MTJ 70 located above the "top" of the vertically-oriented magnetic nanowire column 25, arranged such that the field from the magnetized nanowire couples to the free layer of the MTJ 70. In this configuration, depending on whether the end magnetization of the nanowire is up or down, the magnetization of the MTJ's free layer is driven up or down, resulting in a low or high resistance of the MTJ 70, respectively.

In exemplary embodiments, the magnetization of the top end 60 of the vertically-oriented magnetic nanowire column 25 changes from upward-pointing to down-ward-pointing and the like, as domain walls are propagated upward in vertically-oriented magnetic nanowire column 25 and are annihilated upon reaching the top end 60 of the vertically-oriented magnetic nanowire column 25.

In exemplary embodiments, by dissociating the MTJ read current path from the nanowire shift current path (i.e., removing the MTJ from the side of the nanowire as in conventional devices), a more reliable operation of the device 100 is enabled, since read-current disturbs of the DW position are eliminated.

In addition, by dissociating the MTJ 70 from the vertically-oriented magnetic nanowire column 25, an easier fabrication method can be implemented, which is more robust against defects formed on the nanowire that can result when the MTJ is in intimate contact with the nanowire (i.e., fabricated to the side as in conventional nanowires). Exemplary fabrication methods for the exemplary racetrack memory cell device 100 are described further herein.

Figure 2:
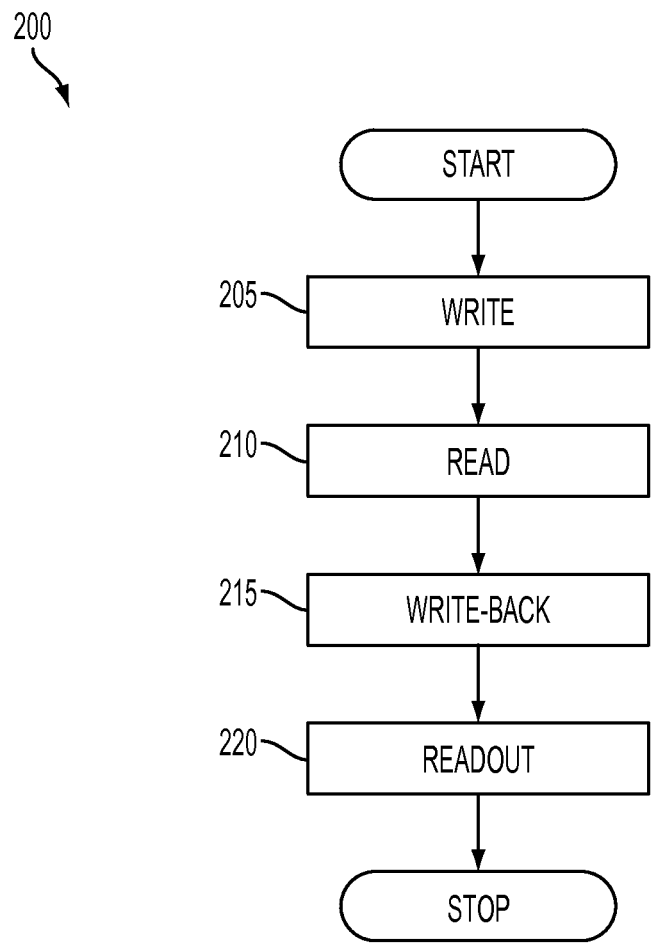
FIG. 2 illustrates a flowchart of a method for operating a racetrack memory cell device with a vertically-oriented magnetic nanowire column, in accordance with exemplary embodiments.

In exemplary embodiments, operation of the exemplary racetrack memory cell device 100 includes a first-in, first-out methodology. FIG. 2 illustrates a flowchart of a method 200 for operating an exemplary racetrack memory cell device with a vertically-oriented magnetic nanowire column, such as the exemplary racetrack memory cell device 100 of FIG. 1. The methodology includes 1) writing at block 205, which includes injecting a domain wall, shifting the domain wall upward, and injecting further domain walls in a similar manner; and 2) reading at block 210, which entails first measuring the domain magnetization at the top of the vertically-oriented magnetic nanowire column 25 using the MTJ 70, then shifting all domain walls upward and destroying the previously read-out domain as the top-most domain wall reaches the top of the vertically-oriented magnetic nanowire column 25 and is annihilated. In addition and "write-back" at block 215 of the destructed domain into the other end of the vertically-oriented magnetic nanowire column 25 via domain wall injection is performed. Similarly, readout at block 220 of subsequent domains is performed sequentially, in a similar manner.

Figure 3:
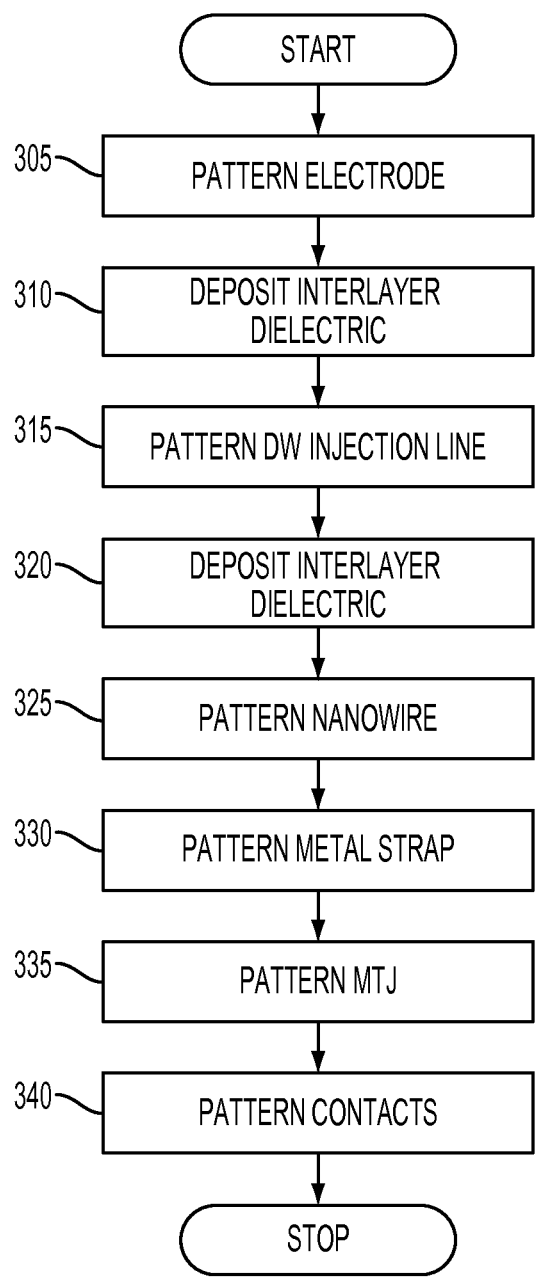
FIG. 3 illustrates a flowchart for a method of fabricating a racetrack memory cell device with a vertically-oriented magnetic nanowire column in accordance with exemplary embodiments.
Figure 4A:
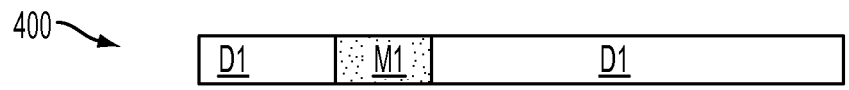
FIG. 4A illustrates a starting structure for a racetrack memory cell device with a vertically-oriented magnetic nanowire column.

FIG. 3 illustrates a flowchart for a method 300 of fabricating a racetrack memory cell device with a vertically-oriented magnetic nanowire column in accordance with exemplary embodiments. FIG. 4A illustrates a starting structure 400 for a racetrack memory cell device with a vertically-oriented magnetic nanowire column. At block 305 of FIG. 3, standard fabrication of a CMOS chip from transistors is implemented to include, among other things, the starting structure 400. The starting structure 400 includes a first dielectric layer D1, with a first metal layer M1 (i.e., the electrode 10 in FIG. 1) patterned within the first dielectric layer D1. Standard CMOS techniques such as copper damascene can be implemented to form the starting structure 400.

Figure 4B:
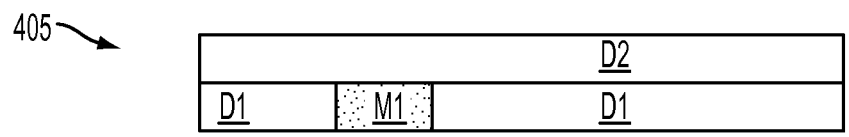
FIG. 4B illustrates an intermediate structure for a racetrack memory cell device with a vertically-oriented magnetic nanowire column.

FIG. 4B illustrates an intermediate structure 405 for a racetrack memory cell device with a vertically-oriented magnetic nanowire column. At block 310 of FIG. 3, a second (interlayer) dielectric layer D2 is deposited over the first metal layer M1 and the first dielectric layer D1. Standard dielectric deposition techniques can be implemented to deposit the second dielectric layer D2.

Figure 4C:
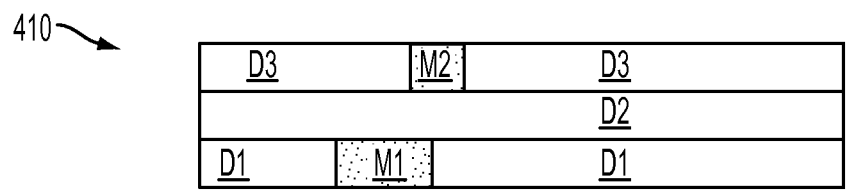
FIG. 4C illustrates an intermediate structure for a racetrack memory cell device with a vertically-oriented magnetic nanowire column.

FIG. 4C illustrates an intermediate structure 410 for a racetrack memory cell device with a vertically-oriented magnetic nanowire column. At block 315 of FIG. 3, a second metal layer M2 (i.e., the DW injection line 30 of FIG. 1) is patterned in a third dielectric layer D3. The third dielectric layer D3 is deposited over the second dielectric layer D2. A recess is etched into the third dielectric layer D3 so that the second metal layer M2 can be patterned. The etch stops at the second dielectric layer D2. Any metal deposition technique can be implemented to fill the recess with the second metal layer M2, including, but not limited to electroplating and sputtering. Standard photolithography and etching techniques can be implemented to pattern the second metal layer M2.

Figure 4D:
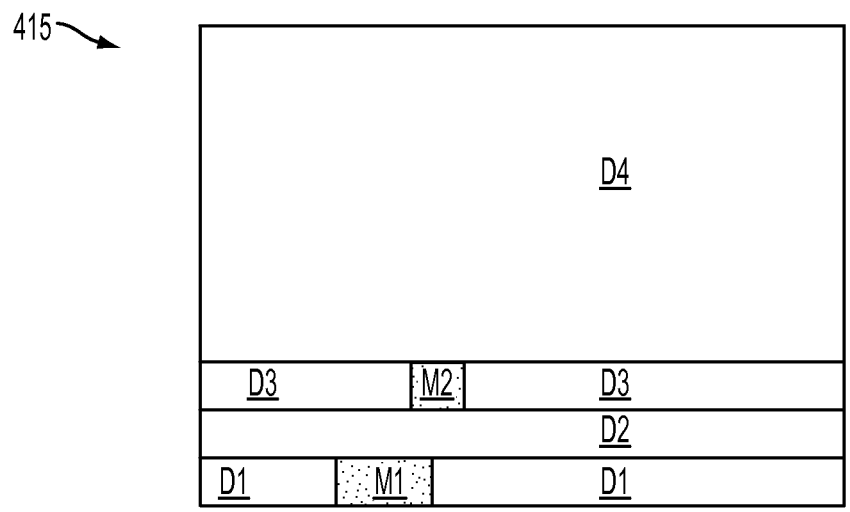
FIG. 4D illustrates an intermediate structure for a racetrack memory cell device with a vertically-oriented magnetic nanowire column.

FIG. 4D illustrates an intermediate structure 415 for a racetrack memory cell device with a vertically-oriented magnetic nanowire column. At block 320 of FIG. 3, a fourth (interlayer) dielectric layer D4 is deposited over the second metal layer M2 and the third dielectric layer D3. The fourth dielectric layer is relatively thicker than the first second and third dielectric layers D1, D2, D3. Standard dielectric deposition techniques can be implemented to deposit the fourth dielectric layer D4.

Figure 4E:
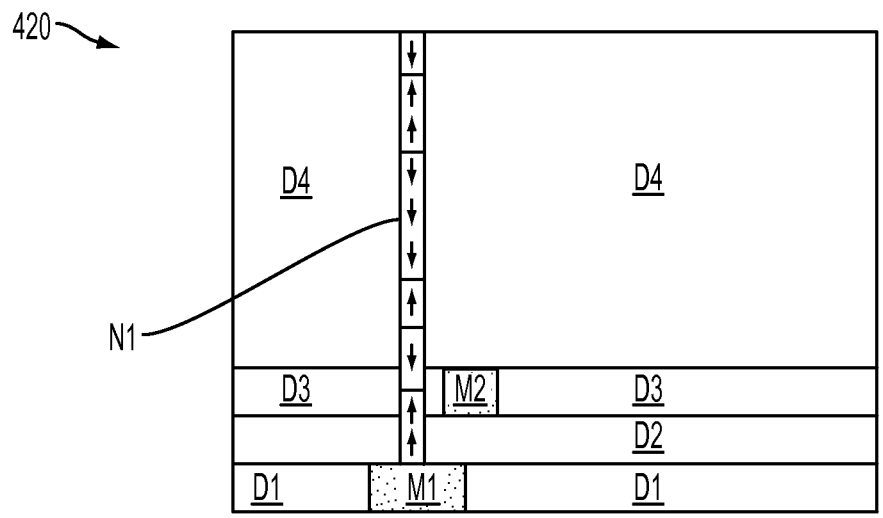
FIG. 4E illustrates an intermediate structure for a racetrack memory cell device with a vertically-oriented magnetic nanowire column.

FIG. 4E illustrates an intermediate structure 420 for a racetrack memory cell device with a vertically-oriented magnetic nanowire column. At block 325 of FIG. 3, a vertically oriented magnetic nanowire column N1 is patterned. Standard photolithography and etching techniques are implemented to etch a recess into the fourth, third and second dielectric layers D4, D3, D2. The etch ceases at the first metal layer M1. The nanowire material is then deposited into the hole using a technique such as electroplating or atomic layer deposition, so that the hole is filled with magnetic material. Excess material deposited elsewhere may be removed using a chemical mechanical polish to planarize the surface above the nanowire N1 and the fourth dielectric layer D4.

Figure 4F:
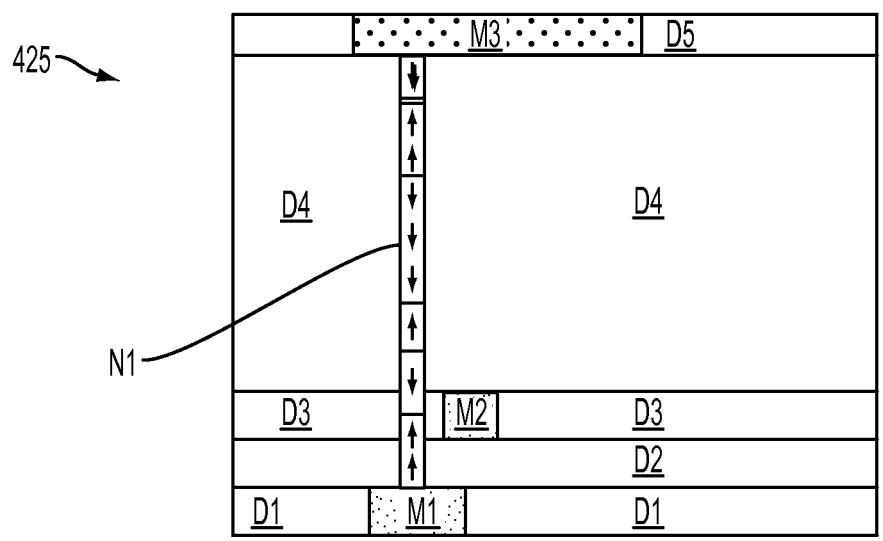
FIG. 4F illustrates an intermediate structure for a racetrack memory cell device with a vertically-oriented magnetic nanowire column.

FIG. 4F illustrates an intermediate structure 425 for a racetrack memory cell device with a vertically-oriented magnetic nanowire column. At block 330 of FIG. 3, a third metal layer M3 (i.e., the metal strap 50 of FIG. 1) is patterned in a fifth dielectric layer D5. The fifth dielectric layer D5 is deposited over the fourth dielectric layer D4 and the nanowire N1. A recess is etched into the fifth dielectric layer D5 so that the third metal layer M3 can be patterned. The etch stops at the fourth dielectric layer D4 and the end of the nanowire N1. Any metal deposition technique can be implemented to fill the recess with the third metal layer M3, including, but not limited to electroplating and sputtering, or a damascene process. Standard photolithography and etching techniques can be implemented to pattern the third metal layer M3. After the third metal layer M3 is patterned, chemical-mechanical polishing of the third metal layer M3 can be performed to define metal wire straps. Alternatively, the strap metal can be defined by depositing a blank metal film and then etching to form the strap wires.

Figure 4G:
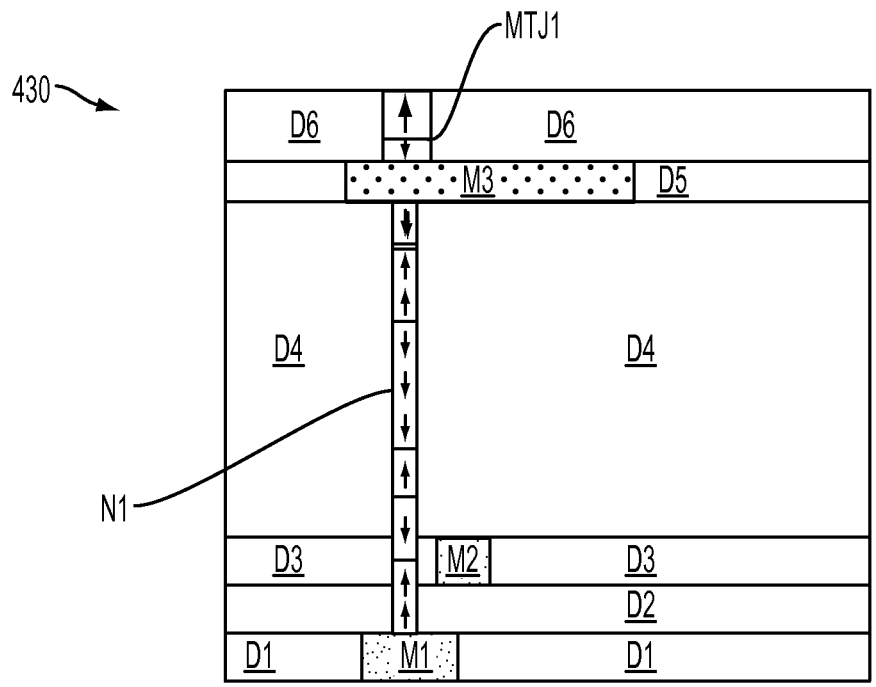
FIG. 4G illustrates an intermediate structure for a racetrack memory cell device with a vertically-oriented magnetic nanowire column.

FIG. 4G illustrates an intermediate structure 430 for a racetrack memory cell device with a vertically-oriented magnetic nanowire column. At block 335 of FIG. 3, a magnetic tunnel junction MTJ1 (i.e., the MTJ 70 in FIG. 1) is patterned in a sixth (interlayer) dielectric layer D6. Standard photolithography and etching techniques can be implemented to pattern the magnetic tunnel junction MTJ1. In exemplary embodiments, the magnetic tunnel junction MTJ1 can be patterned by blanket deposition of a sheet of magnetic materials followed by a subtractive etch to pattern the magnetic tunnel junction MTJ1. After the magnetic tunnel junction MTJ1 is patterned, the MTJ is optionally encapsulated by a thin dielectric (not shown) and then the dielectric layer D6 is deposited over the MTJ and over the fifth dielectric layer D5 and the third metal layer M3. The dielectric layer D6 may be panarizing as deposited, or chemical-mechanical polishing of the dielectric layer D6 may be performed to planarize the dielectric. Etching of the magnetic tunnel junction MTJ1 defines the magnetic tunnel junction MTJ1 directly over the top of the magnetic nanowire N1, and as further described herein enables connection to the third metal layer M3 through a via. During processing the magnetic tunnel junction MTJ1 can be encapsulated with a dielectric.

Figure 4H:
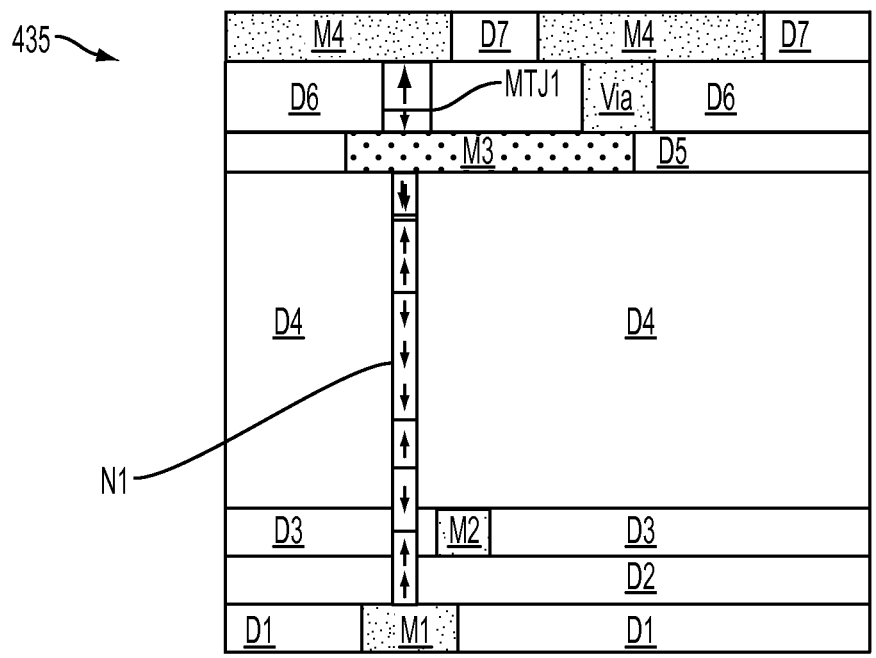
FIG. 4H illustrates a final structure for a racetrack memory cell device with a vertically-oriented magnetic nanowire column.

FIG. 4H illustrates a final structure 435 for a racetrack memory cell device with a vertically-oriented magnetic nanowire column. At block 340 of FIG. 3, contacts (i.e., the top contact 90 for the MTJ 70 and the bottom contact 95 for the MTJ 70 in FIG. 1) are patterned. As described herein, a via 80 is implemented to connect the magnetic tunnel junction MTJ1 to the bottom contact 95 through the metal strap 50 and the via 80. In exemplary embodiments, standard photolithography and etching techniques are implemented to etch a recess into the sixth dielectric layer D6. The etch stops at the third metal layer M3 and the fifth dielectric layer D5. Any metal deposition technique can then be implemented to fill the recess with via 80, including, but not limited to electroplating and sputtering, or a damascene process. A seventh dielectric layer D7 is deposited over the sixth dielectric layer D6, the magnetic tunnel junction MTJ1 and the via 80. Recesses are etched into the seventh dielectric layer D7 so that the fourth metal layer M4 can be patterned. Standard photolithography and etching techniques are implemented to etch a recess into the seventh dielectric layer D7. The etch stops at the sixth dielectric layer D6, the magnetic tunnel junction MTJ1 and the via. Standard photolithography and etching techniques can be implemented to pattern the fourth metal layer M4. Any metal deposition technique can then be implemented to fill the recesses with the fourth metal layer M4, including, but not limited to electroplating and sputtering, or a cooper damascene or dual damascene process. After the fourth metal layer M4 is patterned, chemical-mechanical polishing of the fourth metal layer M4 can be performed to form wires. Alternatively, the fourth metal layer M4 can be defined by depositing a blank metal film and then etching to form the wires. The final structure 435 can have subsequent wiring and contact levels processed in a standard manner.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of operating a racetrack memory cell device the method comprising:
    writing and shifting a domain wall in a nanowire;
    reading a domain magnetization from the nanowire; and
    shifting the domain wall in the nanowire.

2. The method as claimed in claim 1 further comprising writing back destroyed domain walls in the nanowire.

3. The method as claimed in claim 2 further comprising reading out subsequent domain walls from the nanowire.

4. A method of fabricating a racetrack memory cell device, the method comprising:
    forming an electrode in a dielectric; and
    forming a vertically oriented nanowire in the dielectric and coupled to the electrode.

5. The method as claimed in claim 4 further comprising patterning a domain wall in the dielectric and adjacent the nanowire.

6. The method as claimed in claim 5 further comprising patterning a magnetic tunnel junction in the dielectric.

7. The method as claimed in claim 6 wherein the MTJ is axially arranged with the nanowire.

8. The method as claimed in claim 4 further comprising patterning contacts within the dielectric.

* * * * *